United States Patent
Koike et al.

(10) Patent No.: US 11,404,614 B2
(45) Date of Patent: Aug. 2, 2022

(54) LIGHT-EMITTING DEVICE

(71) Applicant: STANLEY ELECTRIC CO., LTD., Tokyo (JP)

(72) Inventors: Kyotaro Koike, Tokyo (JP); Ji-Hao Liang, Tokyo (JP); Mitsunori Harada, Tokyo (JP); Kaori Tachibana, Tokyo (JP); Shunya Ide, Tokyo (JP); Hiroshi Kotani, Tokyo (JP); Satoshi Ando, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/874,807

(22) Filed: May 15, 2020

(65) Prior Publication Data
US 2020/0365775 A1   Nov. 19, 2020

(30) Foreign Application Priority Data

May 16, 2019 (JP) .............................. JP2019-092662

(51) Int. Cl.
*H01L 33/00* (2010.01)
*H01L 33/50* (2010.01)
(Continued)

(52) U.S. Cl.
CPC .......... *H01L 33/505* (2013.01); *H01L 33/507* (2013.01); *H01L 33/58* (2013.01);
(Continued)

(58) Field of Classification Search
CPC ..... H01L 33/50–508; H01L 2933/0041; F21K 9/64
See application file for complete search history.

(56) References Cited

U.S. PATENT DOCUMENTS

| 8,508,118 | B2 * | 8/2013 | Kotani | .................... H01L 33/60 |
| | | | | 313/501 |
| 2008/0055901 | A1 * | 3/2008 | Sanpei | .................... F21V 31/04 |
| | | | | 362/235 |

(Continued)

FOREIGN PATENT DOCUMENTS

| JP | 2010-272847 A | 12/2010 | |
| JP | 2020188178 A | * 11/2020 | .............. H01L 33/50 |

*Primary Examiner* — Mary A Wilczewski
*Assistant Examiner* — Tsz K Chiu
(74) *Attorney, Agent, or Firm* — Xsensus LLP (57) ABSTRACT

Provided is a light-emitting device having a plurality of light-emitting elements with high operation stability and light extraction efficiency. The light-emitting device includes: a light-emitting element; a translucent member which is disposed on the light-emitting element and has a columnar first portion having a bottom surface opposed to an upper surface of the light-emitting element, a second portion formed continuously with the first portion on the first portion and narrowed upward, and a columnar third portion formed continuously with the second portion on the second portion; and a reflective member configured to cover the side surfaces of the translucent member. In this light-emitting device, the height of the first portion of the translucent member in a direction perpendicular to the bottom surface thereof is ⅙ or more the height of the translucent member in the direction perpendicular to the bottom surface.

21 Claims, 7 Drawing Sheets

(51) Int. Cl.
  *H01L 33/60* (2010.01)
  *H01L 33/62* (2010.01)
  *H01L 33/58* (2010.01)
  *H01L 33/32* (2010.01)
  *H01L 33/06* (2010.01)
  *H01L 33/24* (2010.01)

(52) U.S. Cl.
  CPC .............. *H01L 33/60* (2013.01); *H01L 33/62* (2013.01); *H01L 33/06* (2013.01); *H01L 33/24* (2013.01); *H01L 33/32* (2013.01); *H01L 33/50* (2013.01); *H01L 33/502* (2013.01); *H01L 2933/0041* (2013.01); *H01L 2933/0058* (2013.01)

(56) References Cited

U.S. PATENT DOCUMENTS

| | | | | |
|---|---|---|---|---|
| 2009/0039272 | A1* | 2/2009 | Krummacher | H01L 51/5036 250/370.01 |
| 2009/0103297 | A1* | 4/2009 | Bogner | H01L 33/62 362/235 |
| 2009/0140272 | A1* | 6/2009 | Beeson | H01L 33/505 257/89 |
| 2009/0195152 | A1* | 8/2009 | Sawano | H01L 27/322 313/504 |
| 2010/0051988 | A1* | 3/2010 | Mitsuishi | F21K 9/00 257/98 |
| 2010/0148196 | A1* | 6/2010 | Kamada | F21K 9/00 257/98 |
| 2010/0264438 | A1* | 10/2010 | Suenaga | H01L 33/58 257/98 |
| 2011/0235355 | A1* | 9/2011 | Seko | F21S 41/151 362/510 |
| 2012/0193665 | A1* | 8/2012 | Yamada | H01L 24/17 257/E33.072 |
| 2012/0299043 | A1* | 11/2012 | Hsu | H01L 33/58 257/98 |
| 2013/0099264 | A1* | 4/2013 | Zimmerman | H01L 33/641 257/89 |
| 2013/0121009 | A1* | 5/2013 | Tsutsumi | H01L 33/44 362/510 |
| 2013/0221389 | A1* | 8/2013 | Yamamuro | H01L 33/50 257/98 |
| 2014/0110736 | A1* | 4/2014 | Waragaya | H01L 33/505 257/98 |
| 2014/0203306 | A1* | 7/2014 | Ito | H01L 33/0075 257/88 |
| 2015/0102377 | A1* | 4/2015 | Huang | H01L 33/58 257/98 |
| 2015/0188004 | A1* | 7/2015 | Ozeki | H01L 25/0753 257/98 |
| 2018/0123001 | A1* | 5/2018 | Hung | H01L 33/486 |
| 2018/0138378 | A1* | 5/2018 | Hung | H01L 25/0753 |
| 2018/0269365 | A1* | 9/2018 | Schubert | H01L 33/0095 |
| 2019/0277455 | A1* | 9/2019 | Xu | H01L 25/0753 |

* cited by examiner

LIGHT-EMITTING DEVICE

This application claims the priority benefit under 35 U.S.C. § 119 of Japanese Patent Application No. 2019-092662 filed on May 16, 2019, which is hereby incorporated in its entirety by reference.

TECHNICAL FIELD

The present invention relates to a light-emitting device including a light-emitting element, such as a light-emitting diode.

BACKGROUND ART

The light-emitting device includes, for example, a substrate on which terminals and wiring or the like are disposed, and at least one light-emitting element mounted on the substrate. When the light-emitting device is used for illumination, for example, such a light-emitting device can include a wavelength converter such as a phosphor layer disposed on the light-emitting element.

As such a light-emitting device, Patent Document 1 (Japanese Patent Application Laid-Open No. 2010-272847 A, US Patent Application Publication corresponding thereto: US2010/0264438A1) discloses a light-emitting device including: a light-emitting element having an upper surface as a light-emitting surface; a translucent member provided on the light-emitting element, the translucent member having an upper surface and a lower surface where light emitted from the light-emitting element is incident on the lower surface and allowed to exit to the outside through the upper surface; and a light reflective resin configured to cover at least a portion of the translucent member.

However, the light-emitting device of Patent Document 1 has a problem in which the light extraction efficiency of the light-emitting device may be lowered because the light is confined in the region of the side end portion in the translucent member.

SUMMARY

The present invention was devised in view of these and other problems and features in association with the conventional art. According to an aspect of the present invention, there can be provided a light-emitting device having high light extraction efficiency.

According to another aspect of the present invention, a light-emitting device according to the present invention includes: a light-emitting element; a translucent member which is disposed on the light-emitting element and has a columnar first portion having a bottom surface opposed to an upper surface of the light-emitting element, a second portion formed continuously with the first portion on the first portion and narrowed upward, and a columnar third portion formed continuously with the second portion on the second portion; and a reflective member configured to cover side surfaces of the translucent member. In this light-emitting device, the height of the first portion of the translucent member in a direction perpendicular to the bottom surface thereof is ⅙ or more the height of the translucent member in the direction perpendicular to the bottom surface.

In the light-emitting device described above, the height of the translucent member in the direction perpendicular to the bottom surface may be 30 μm to 300 μm.

In the light-emitting device described above, the translucent member may contain a fluorescent material that converts a wavelength of the light emitted from the light-emitting element.

The light-emitting device described above may further include a wavelength conversion member provided between the translucent member and the light-emitting element, the wavelength conversion member being configured to convert a wavelength of the light emitted from the light-emitting element.

In the light-emitting device described above, the second portion of the translucent member may be formed into a frustum shape.

In the light-emitting device described above, the light-emitting element may have an upper surface having a larger area than an upper surface of the third portion of the translucent member.

In the light-emitting device described above, the light-emitting element may include a support substrate and a semiconductor laminate disposed on the support substrate, and the translucent member containing the fluorescent material or the wavelength conversion member may have a bottom surface which is bonded to an upper surface of the semiconductor laminate. In this light-emitting device, the bottom surface of the translucent member containing the fluorescent material or the wavelength conversion member may be bonded to the upper surface of the semiconductor laminate with a transparent adhesive so that the transparent adhesive covers side surfaces and the upper surface of the semiconductor laminate and the bottom surface of the translucent member or the wavelength conversion member.

The foregoing light-emitting device can exhibit high light extraction efficiency by increasing effective use of the amount of the light travelling within the wavelength conversion member or the like.

BRIEF DESCRIPTION OF DRAWINGS

These and other characteristics, features, and advantages of the present invention will become clear from the following description with reference to the accompanying drawings, wherein.

DESCRIPTION OF EXEMPLARY EMBODIMENTS

A description will now be made below to light-emitting devices of the present invention with reference to the accompanying drawings in accordance with exemplary embodiments.

First Embodiment

Figure 1:
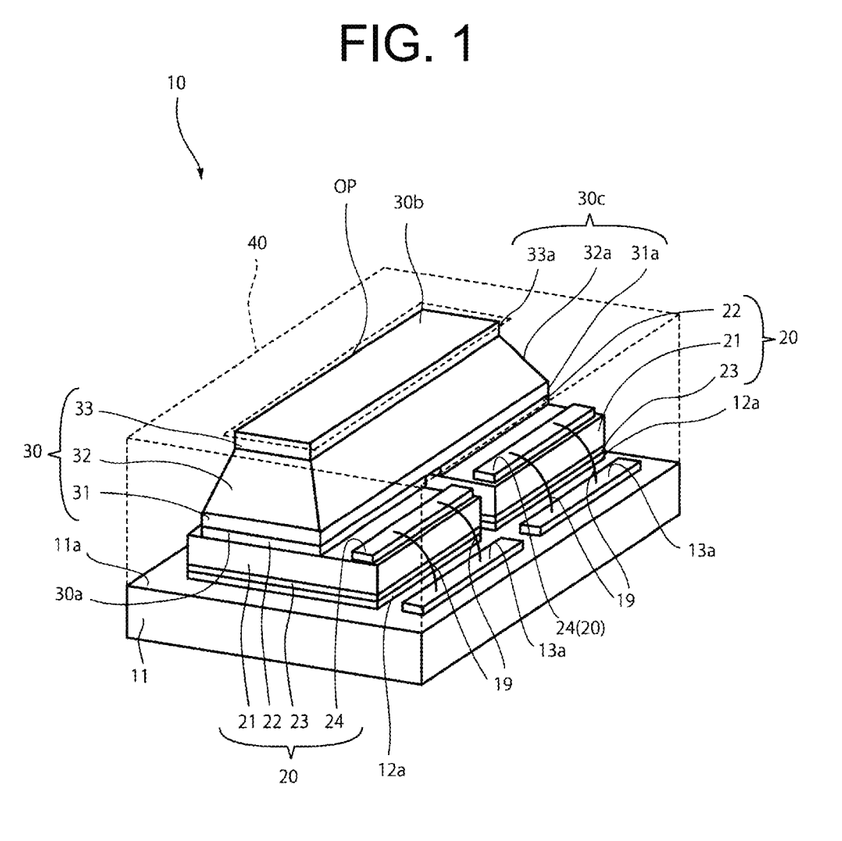
FIG. 1 is a perspective view illustrating a light-emitting device made in accordance with principles of the present invention as a first embodiment.

FIG. 1 is a perspective view illustrating a configuration of a light-emitting device 10 according to a first embodiment of the present invention. As illustrated in FIG. 1, the light-emitting device 10 includes a mounting substrate 11 which is a rectangular plate-shaped substrate having a rectangular-shaped mounting surface 11a. As the mounting substrate 11, for example, a substrate made of AlN, alumina, or the like can be used.

The light-emitting device 10 further includes two n-side power feeding pads 12a. In this embodiment, the n-side power feeding pads 12a are planar rectangular metal wiring electrode patterns disposed spaced apart from each other on the mounting surface 11a. Specifically, the n-side power feeding pads 12a are arranged along the longitudinal direction of the mounting surface 11a so that one side of each of the n-side power feeding pads 12a is arranged along the extending direction of the long side of the mounting surface 11a. The n-side power feeding pad 12a, for example, is configured to be connectable to an external power supply via a through-hole formed so as to penetrate the mounting substrate 11 vertically.

The light-emitting device 10 further includes two p-side power feeding pads 13a. The p-side power feeding pads 13a are planar rectangular metal wiring electrode patterns disposed spaced apart from each other on the mounting surface 11a. Each of the p-side power feeding pads 13a is disposed between each of the n-side power feeding pads 12a and one of the long sides of the mounting surface 11a. In other words, each of the p-side power feeding pads 13a is arranged at or substantially at one end of the mounting substrate 11 in the short-side direction. More specifically, each of the p-side power feeding pads 13a is arranged along the one long side of the mounting surface 11a. For example, the p-side power feeding pads 13a are configured to be connectable to the external power supply, for example.

The light-emitting device 10 further includes two light-emitting elements 20 which are mounted on the mounting surface 11a of the mounting substrate 11. More specifically, each of the light-emitting elements 20 is disposed on each of the n-side power feeding pads 12a. Each of the light-emitting elements 20 is, for example, a semiconductor light-emitting element such as a light-emitting diode.

Each of the light-emitting elements 20 includes a support substrate 21, which is a rectangular plate-shaped substrate having electroconductivity and formed from, for example, an Si substrate. Each of the light-emitting elements 20 includes a semiconductor laminate 22 provided on the upper surface of the support substrate 21. The semiconductor laminate 22 is bonded to the support substrate 21 via a metallic bonding layer (not illustrated). For example, the metallic bonding layer includes two layers which are spaced apart from each other on the upper surface of the support substrate 21 and are electrically insulated from each other. One of the two layers is electrically connected to the support substrate 21, and the other is electrically insulated from the support substrate 21 by, for example, an insulating layer formed on the upper surface of the support substrate 21. The semiconductor laminate 22 is composed of a plurality of semiconductor layers including an active layer.

Each of the semiconductor laminates 22 is constituted by a p-type semiconductor layer, the active layer, and an n-type semiconductor layer, which are stacked from the support substrate 21 side in this order. The p-type semiconductor layer is, for example, a GaN layer doped with Mg. The active layer, or a light-emitting layer, is, for example, a semiconductor layer having a multiple quantum well structure composed of InGaN well layers and GaN barrier layers. The n-type semiconductor layer is, for example, a GaN layer doped with Si. With this configuration, the wavelength of the outgoing light emitted from the active layer is adjusted to a wavelength corresponding to the materials and composition of the semiconductor laminate 22. For example, blue light is emitted from the light-emitting layer of each of the light-emitting elements 20. The upper surface of the semiconductor laminate 22 serves as a light-emitting surface through which outgoing light (hereinafter, simply referred to as light) is mainly emitted.

Herein, the p-type semiconductor layer is electrically connected to the bonding layer which is insulated from the support substrate 21 out of the bonding layers described above, and the n-type semiconductor layer is electrically connected to the bonding layer which is electrically connected to the support substrate 21.

Each of the light-emitting elements 20 further includes a rear electrode 23 which is formed so as to cover the bottom surface of the support substrate 21. The rear electrode 23 is a metallic electrode formed on the lower surface of the support substrate 21, and is electrically connected to the n-side power feeding pad 12a via an electroconductive bonding material (not illustrated).

Each of the light-emitting elements 20 further includes a power feeding part 24, which is a metallic electrode disposed on a metal layer (not illustrated). Each of the power feeding parts 24 has a rectangular planar shape in this embodiment. Each of the power feeding parts 24 extends along a side in the vicinity of the p-side power feeding pad 13a provided on the upper surface of the support substrate 21.

Each of the power feeding parts 24 is insulated from the support substrate 21 by, for example, an insulating layer (not illustrated) formed on the upper surface of the support substrate 21. Further, each of the power feeding parts 24 is electrically connected to the bonding layer (not illustrated) of the support substrate 21 which is one insulated from each of the support substrates 21 described above. Therefore, each of the power feeding parts 24 is electrically connected to the p-type semiconductor layer of the semiconductor laminate 22 via the metal layer. The path of the current between the p-type semiconductor layer and the power feeding part 24 is electrically isolated from the support substrate 21 by the insulating layer.

Each of the power feeding parts 24 is electrically connected to the p-side power feeding pad 13a provided on the mounting surface 11a of the mounting substrate 11 via a bonding wire 19.

Thus, the light-emitting element 20 is configured to include the support substrate 21, the semiconductor laminate 22, the rear electrode 23, and the power feeding part 24. The light-emitting element 20 is a top emission type element having a thin film type bonded structure. The upper surface of the semiconductor laminate 22 (not illustrated) serves as a light-emitting surface of the light-emitting element 20.

The structure of the thin film type element can be formed by a step of growing the semiconductor laminate 22 on a growth substrate (not illustrated), a step of bonding the semiconductor laminate 22 to the support substrate 21, and a so-called laser lift-off step of removing the growth substrate, for example, by irradiating a laser.

The light-emitting device 10 further includes a wavelength conversion part 30 as a translucent member provided on the light-emitting surfaces of the two light-emitting elements 20. The wavelength conversion part 30 is formed from a translucent member that is transparent to light emitted from the light-emitting element 20. In this embodiment, the wavelength conversion part 30 is formed so as to straddle the two light-emitting elements 20. In other words, the wavelength conversion part 30 extends on the two light-emitting elements 20 along the arrangement direction of the light-emitting elements 20.

The wavelength conversion part 30 is formed from, for example, a ceramic plate obtained by sintering a fluorescent material. The ceramic plate is produced, for example, by firing alumina and a fluorescent material at high temperatures. Examples of the fluorescent material may include a YAG (Yttrium Aluminum Garnet: $Y_3Al_5O_{12}$) fluorescent material.

The wavelength conversion part 30 may be a resin layer containing particles of a fluorescent material. In this case, the resin layer is formed by mixing a fluorescent material into a resin raw material such as an epoxy resin or a silicone resin, and then curing the resin raw material.

The wavelength conversion part 30 has a bottom surface 30a formed on a side closer to the semiconductor laminate 22 of the light-emitting element 20, an upper surface 30b formed on a side farther from the semiconductor laminate 22 of the light-emitting element 20, and a side surface 30c formed from the bottom surface 30a to the upper surface 30b.

The bottom surface 30a and the upper surface 30b of the wavelength conversion part 30 are configured to be made parallel to the mounting surface 11a of the mounting substrate 11, for example. Further, the bottom surface 30a and the upper surface 30b of the wavelength conversion part 30 are configured to be made parallel to the principal surface of the support substrate 21.

The wavelength conversion part 30 includes a first prismatic portion (also referred to as a (columnar) first portion) 31 formed in a columnar shape, a frustum portion (also referred to as a second portion) 32 formed in a frustum shape following the first prismatic portion 31 above the first prismatic portion 31, and a second prismatic portion (also referred to as a (columnar) third portion) 33 formed in a columnar shape following the frustum portion 32 above the frustum portion 32. The first prismatic portion 31, frustum portion 32 and second prismatic portion 33 are not separable but are integrally formed.

The first prismatic portion 31 is formed in a rectangular parallelepiped shape. The shape of the first prismatic portion 31 is not limited to a rectangular parallelepiped shape, that is, a quadrangular columnar shape, and may be formed in a polygonal columnar shape other than a quadrangular columnar shape, for example. The first prismatic portion 31 has a side surface 31a which is formed by extending in a direction perpendicular to the bottom surface 30a. The side surface 31a of the first prismatic portion 31 is a side surface formed by a portion of the wavelength conversion part 30 close to the bottom surface 30a.

The frustum portion 32 has a quadrangular frustum shape (truncated pyramid shape) that narrows upward. That is, frustum portion 32 has a side surface 32a inclined with respect to the bottom surface 30a inwardly toward the upper side. The side surface 32a of the frustum portion 32 is formed continuously from the side surface 31a of the first prismatic portion 31 due to the integral form.

The second prismatic portion 33 is formed in a rectangular parallelepiped shape. The shape of the second prismatic portion 33 is not limited to a rectangular parallelepiped shape, that is, a quadrangular columnar shape, and may be formed in a polygonal columnar shape other than a quadrangular columnar shape, for example. The second prismatic portion 33 has a side surface 33a which is formed by extending in a direction perpendicular to the bottom surface 30a. The side surface 33a of the second prismatic portion 33 is a side surface formed by a portion of the wavelength conversion part 30 close to the upper surface 30a. It is preferable to form a portion that transitions from the side surface 33a to the upper surface 30b to be angular.

The light-emitting device 10 includes a reflection resin 40 as a reflection portion that covers the side surfaces of the light-emitting elements 20 and the side surfaces 30c (side surfaces 31a to 33a) of the wavelength conversion part 30 so as to surround them. The reflective resin 40 is illustrated by a broken line in the drawings in order to clarify the shape of the wavelength conversion part 30 or the like.

The reflective resin 40 is made of, for example, a white resin material having reflectivity with respect to light emitted from each of the light-emitting elements 20 and light outputted from the wavelength conversion part 30. The resin material is a material called as a white resin, for example, in which a light scattering material (white pigment) is dispersed in a thermosetting resin such as a silicone resin or an epoxy resin. As the light scattering material, titanium oxide, zinc oxide, or the like may be used.

The reflective resin 40 buries the side surfaces and the p-side power feeding pad 13a of the semiconductor laminate 22 of the light-emitting element 20 and the bonding wire 19. The reflective resin 40 may also function as a sealing material of the light-emitting device 10.

The reflective resin 40 has an opening OP on the upper surface thereof. The opening OP accommodates the upper surface 30b of the wavelength conversion part 30. In this case, it is preferable that the inner edge of the opening OP be coincident with the outer edge of the upper surface 30b of the wavelength conversion part 30. In this embodiment, the opening OP of the upper surface of the reflective resin 40 and the upper surface 30b of the wavelength conversion part 30 can define the light exiting surface of the light-emitting device 10.

Figure 2:
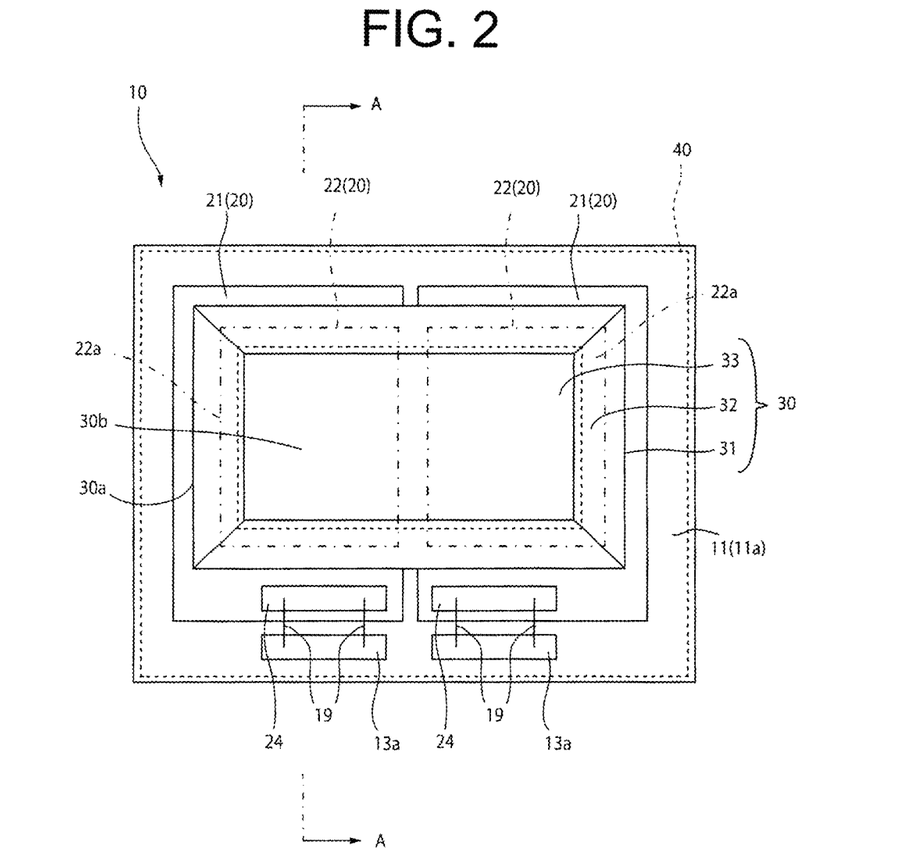
FIG. 2 is a top view of the light-emitting device according to the first embodiment.

FIG. 2 is a top view of the light-emitting device 10 according to the first embodiment. As described above, the mounting substrate 11 is formed in a rectangular shape when seen in a top view, that is, when seen in a direction perpendicular to the mounting surface 11a of the mounting substrate 11.

The support substrate 21 of each of the light-emitting elements 20 is formed in a rectangular shape when seen in a top view. The short side of each of the support substrates 21 is arranged along the longitudinal direction of the mounting substrate 11. Note that the semiconductor laminate 22 is indicated by a dashed line in the drawing. The upper surface 22a of the semiconductor laminate 22 is formed in a rectangular shape.

The first prismatic portion 31 of the wavelength conversion part 30 has a bottom surface having a shape covering the upper surface 22a of the semiconductor laminate 22, or the bottom surface 30a of the wavelength conversion part 30. The bottom surface 30a of the wavelength conversion part 30 is provided to face to the upper surface 22a of the semiconductor laminate 22. The bottom surface 30a of the wavelength conversion part 30 is formed in a rectangular shape. Further, the bottom surface 30a is formed along the upper surface 22a of the semiconductor laminate 22.

The frustum portion 32 of the wavelength conversion part 30 has a bottom surface having a shape covering the upper surface 22a of the semiconductor laminate 22 when seen in a top view. The frustum portion 32 has a shape in which the width in a direction parallel to the light-emitting surface of the light-emitting element 20 is narrowed toward the upper portion. The upper surface and bottom surface of the frustum portion 32 are both formed in a rectangular shape. The bottom surface of the frustum portion 32 is coincident with the upper surface of the first prismatic portion 31 in size and shape.

The second prismatic portion 33 of the wavelength conversion part 30 has a bottom surface having a shape covering the upper surface 22a of the semiconductor laminate 22 when seen in a top view. The second prismatic portion 33 has a shape in which the side surface 33a extends vertically with respect to the bottom surface 30a toward the upper portion. The upper surface of the second prismatic portion 33, i.e., the upper surface 30b of the wavelength conversion part 30 and the bottom surface of the second prismatic portion 33 are formed in a rectangular shape.

The bottom surface of the second prismatic portion 33 is coincident with the upper surface of the frustum portion 32 in size and shape. Further, the upper surface 30b of the wavelength conversion part 30 defines the light exiting surface of the light-emitting device 10.

The bottom surface of the second prismatic portion 33 is smaller in area than the upper surface 22a of the semiconductor laminate 22. Further, when seen in a top view, the contour of the bottom surface of the second prismatic portion 33 of the wavelength conversion part 30 is configured to be along the contour of the upper surface 22a of the semiconductor laminate 22. In other words, the bottom surface of the second prismatic portion 33 covers the upper surface 22a when seen in a top view.

Figure 3:
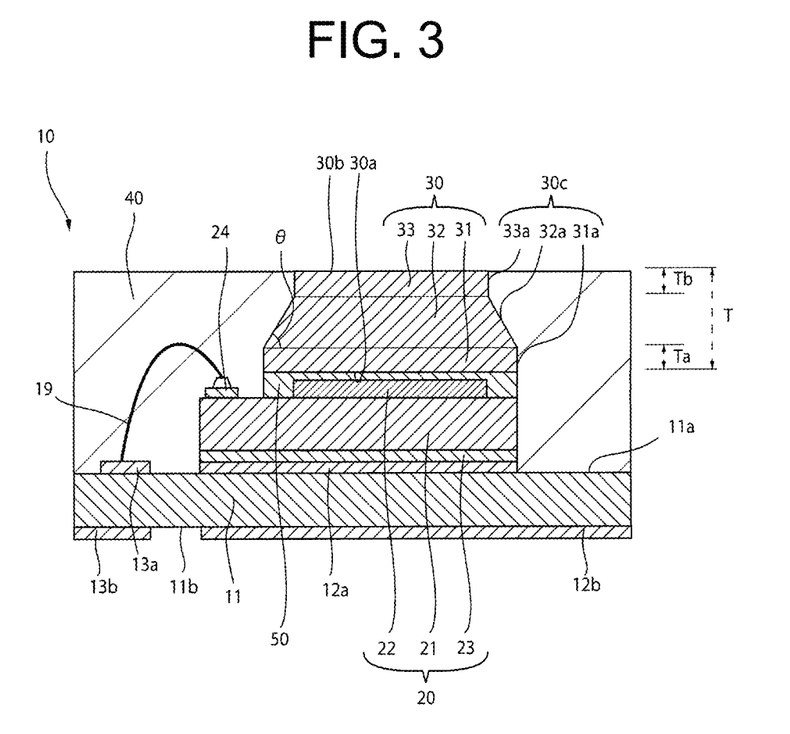
FIG. 3 is a cross-sectional view of the light-emitting device taken along line A-A in FIG. 2.

FIG. 3 illustrates a cross-section of the light-emitting device 10 taken along line A-A of FIG. 2. As illustrated in FIG. 3, the n-side power feeding pad 12a is a metallic wiring electrode pattern provided on the mounting surface 11a of the mounting substrate 11. An n-side rear wiring 12b is a metallic wiring electrode pattern provided on the surface 11b on the opposite side of the mounting surface 11a.

The n-side power feeding pad 12a and the n-side rear wiring 12b are electrically connected to each other through the through-hole (not illustrated) formed through the mounting substrate 11.

The p-side power feeding pad 13a is a metallic wiring electrode pattern provided on the mounting surface 11a of the mounting substrate 11. A p-side rear wiring 13b is a metallic wiring electrode pattern provided on the surface 11b on the opposite side of the mounting surface 11a, and is provided electrically spaced apart from the n-side rear wiring 12b.

The p-side power feeding pad 13a and p-side rear wiring 13b are electrically connected to each other via a through-hole (not illustrated) formed through the mounting substrate 11.

The wavelength conversion part 30 is adhered to the respective upper surfaces of the semiconductor laminates 22 of the light-emitting elements 20 with a transparent adhesive 50 interposed therebetween. In the drawing, the bottom surface 30a of the wavelength conversion part 30 in contact with the transparent adhesive 50 is bonded to the upper surface 22a of the semiconductor laminate 22. In other words, the bottom surface 30a of the wavelength conversion part 30 is bonded to the upper surface 22a of the semiconductor laminate 22 with the transparent adhesive 50 interposed therebetween.

The transparent adhesive 50 covers the side surface and the upper surface of the semiconductor laminate 22, and also covers the bottom surface 30a of the wavelength conversion part 30.

The transparent adhesive 50 is transparent to light emitted from the semiconductor laminate 22. The transparent adhesive 50 is formed, for example, by curing an adhesive containing a resin such as an epoxy resin or a silicone resin. Therefore, the light emitted from the semiconductor laminate 22 can enter the wavelength conversion part 30 via the transparent adhesive 50.

The frustum portion 32 is narrowed upward, and the angle of the side surface 32a with respect to the bottom surface 30a is defined as an angle θ. Specifically, the angle θ can be defined by an angle facing the inside of the frustum portion 32, i.e., an angle facing the inside of the wavelength conversion part 30 out of the angles formed between the side surface 32a and the bottom surface 30a. In other words, the side surface 32a of the frustum portion 32 is inclined by the angle θ with respect to the bottom surface 30a.

Light emitted from each of the light-emitting elements 20 enters the wavelength conversion part 30, and after being converted at least in part of the wavelength of the light, the light is extracted to the outside. This wavelength conversion is performed, for example, by exciting the fluorescent material contained in the wavelength conversion part 30 by the light emitted from the semiconductor laminate 22 and emitting the fluorescence from the fluorescent material.

The light that has been emitted from each of the light-emitting elements 20 and incident on the wavelength conversion part 30 and reached the side surface of the wavelength conversion part 30 is reflected by the reflecting resin 40. Therefore, most light is taken out from the upper surface 30b of the wavelength converting part 30 to the outside. For example, when blue light is emitted from the semiconductor laminate 22 and a fluorescent material that can emit yellow fluorescence is contained in the wavelength conversion part 30, pseud white light (mixed light) is emitted from the upper surface 30b of the wavelength conversion part 30.

Figure 4:
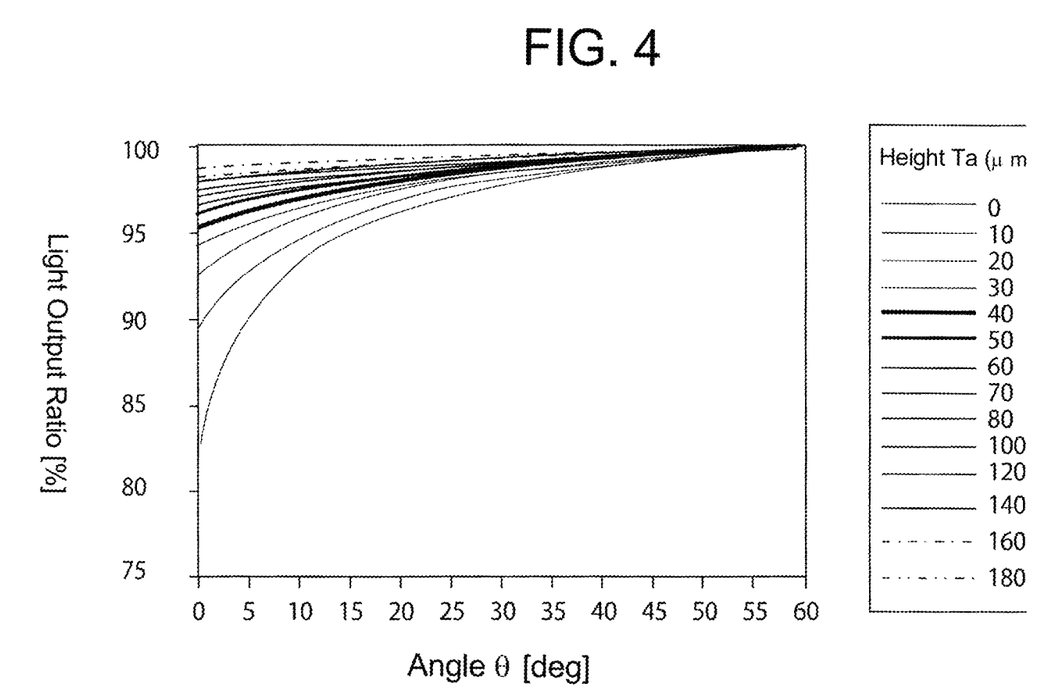
FIG. 4 is a diagram showing a relationship between a light output ratio and an angle of a second portion of a wavelength conversion part of the light-emitting device according to the first embodiment.

FIG. 4 shows the relationship between the light output ratio and the angle of the second portion of the wavelength conversion part of the light-emitting device according to the first embodiment. The light output ratio in FIG. 4 represents a ratio of light output with respect to a light output when the wavelength conversion part 30 is constituted only by the frustum portion 32 and the angle θ of the frustum portion 32 is 60 degrees. In FIG. 4, the measurement was performed using the wavelength conversion part 30 in which the height T of the wavelength conversion part 30 is 200 μm, the width of the bottom surface 30a of the wavelength conversion part 30 is 1000 μm, and the width of the upper surface 30b of the second prismatic portion 33 was 750 μm. That is, in accordance with the change in the angle θ of the frustum portion 32, the height Tb of the second prismatic portion 33 is changed so as not to change the height T of the wavelength conversion part 30.

As illustrated in FIG. 4, when the height Ta of the first prismatic portion 31 is 40 μm or more, that is, ⅕ or more of the height T of the wavelength conversion part 30, the light-emitting device 10 has a light output ratio of 95% or more even if the angle θ of the frustum portion 32 is 0 degrees. Further, the light output ratio increases with an increase in the angle while the angle θ of the frustum portion 32 is between 0 and 60 degrees.

The angle θ of the frustum portion 32 may preferably be between 40 degrees and 60 degrees in the present embodiment. When the angle θ of the frustum portion 32 is 40 degrees to 60 degrees, the light-emitting device 10 has a light output ratio of 97% or more.

Figure 5:
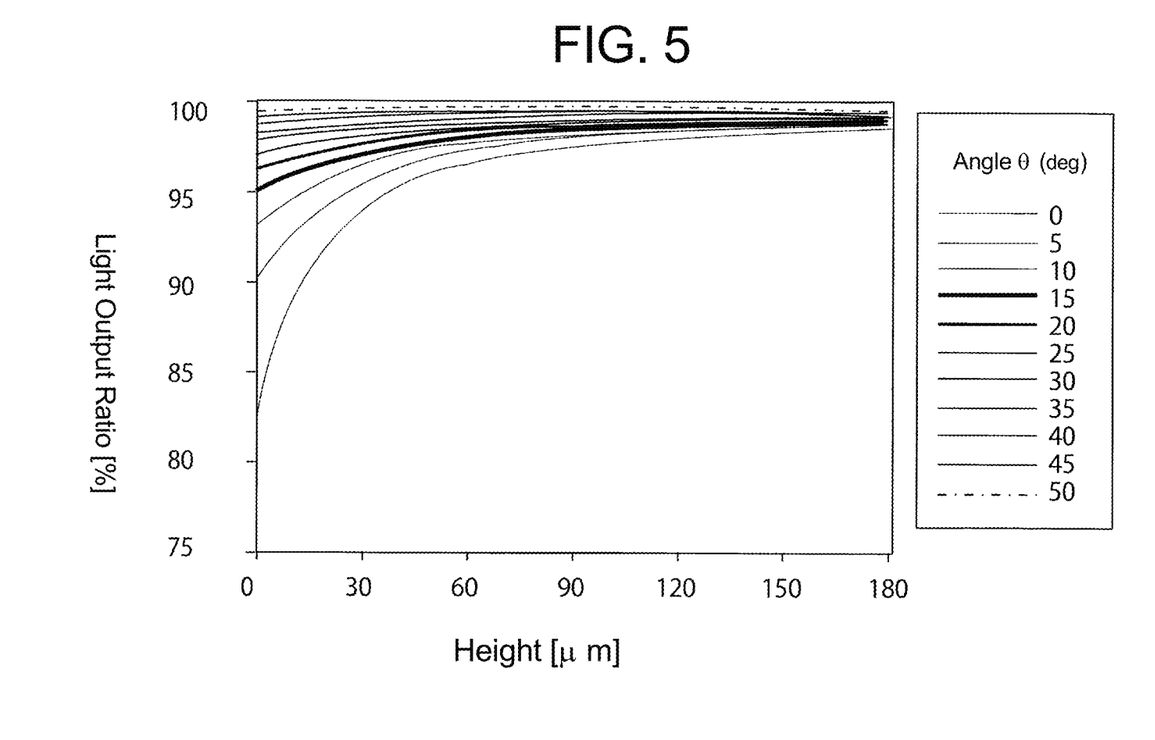
FIG. 5 is a diagram showing a relationship between the light output ratio and a height of a first portion of the wavelength conversion part of the light-emitting device according to the first embodiment.

FIG. 5 shows the relationship between the light output ratio and the height of the first portion of the wavelength conversion part of the light-emitting device according to the first embodiment. The light output ratio in FIG. 5 represents a ratio of light output with respect to a light output when the wavelength conversion part 30 is constituted only by the frustum portion 32 and the angle θ of the frustum portion 32 is 60 degrees. In FIG. 5, the measurement was performed using the wavelength conversion part 30 in which the height T of the wavelength conversion part 30 is 200 μm.

When the height Ta of the first prismatic portion 31 is 30 μm or more, that is, ⅙ the height T of the wavelength conversion part 30, the light-emitting device 10 has a light output ratio of 95% or more regardless of the angle θ of the frustum portion 32.

In this embodiment, the height Ta of the first prismatic portion 31 is preferably 30 to 180 μm, more preferably 30 to 120 μm, from the viewpoint of light extraction efficiency and light collection.

The height Ta of the first prismatic portion 31 is preferably ⅙ to 9/10 the height T of the wavelength conversion part 30, more preferably ⅙ to ⅗ the height T of the wavelength conversion part 30.

The height Tb of the second prismatic portion 31 may preferably be ¼ or less the height T of the wavelength conversion part 30. The height Tb of the second prismatic portion 31 is preferably 1/10 to ¼ the height T of the wavelength conversion part 30, more preferably 1/20 to ⅕ the height T of the wavelength conversion part 30.

Note that if the height T in a direction perpendicular to the bottom surface 30a of the wavelength conversion part 30 is 30 μm to 300 μm, the wavelength conversion part 30 shows a tendency of the same light output ratio as the tendency of the light output ratio described in FIGS. 4 and 5.

Outgoing light emitted from the light-emitting element 20 is incident on the bottom surface 30a of the wavelength conversion part 30. Specifically, the outgoing light enters the frustum portion 32 through the first prismatic portion 31. The outgoing light is reflected toward the upper surface 30b, i.e., the light exiting surface while the traveling direction of the light is changed in the wavelength conversion part 30 inwardly at the side surface 32a of the frustum portion 32. As a result, the light emitted from the light-emitting element 20 is focused toward the light exiting surface.

At this time, for example, if the height Ta of the first prismatic portion 31 is less than ⅙ the height T of the wavelength conversion part 30, the component of the outgoing light which is not reflected by the side surface 31a of the first prismatic portion 31 but is directly reflected by the side surface 32a of the frustum portion 32 increases.

In contrast, when the height Ta of the first prismatic portion 31 is ⅙ or more the height T of the wavelength conversion part 30, the component of the outgoing light which is reflected by the side surface 31a of the first prismatic portion 31 and then reflected by the side surface 32a of the frustum portion 32 increases.

As the height Ta of the first prismatic portion 31 increases, the probability in which the outgoing light emitted from the semiconductor laminate 22 is directed to the semiconductor laminate 22 by reflection by the side surface 32a of the frustum portion 32 is reduced. Therefore, the component of the outgoing light from the first prismatic portion 31 toward the frustum portion 32 increases.

As a result, the light-emitting device 10 according to this embodiment can cause the light emitted from the light-emitting element 20 to travel to the upper surface 30b side of the wavelength conversion part 30, thereby achieving a high light extraction efficiency. In particular, since the side surface 33a of the second prismatic portion 33 is formed in a prism shape, it is possible to prevent the light extraction efficiency from decreasing.

Here, the light extraction efficiency is an efficiency defined by a ratio between the amount of light emitted from the semiconductor laminate 22 and the amount of light exiting to the outside of the light-emitting device 10 via the upper surface 30b, for example.

As described above, the wavelength conversion part 30 has the second prismatic portion 33 on the frustum portion 32. Therefore, when the reflective resin 40 is formed by injecting a flowable resin material from above the mounting substrate 11 by potting or the like, the resin is prevented from creeping up on the upper surface 30b of the wavelength conversion part 30.

Here, when the transparent adhesive 50 does not cover the side surface of the semiconductor laminate 22, it is difficult to reflect the light emitted from the semiconductor laminate 22 by the reflective resin 40 and take out the same. On the other hand, when the transparent adhesive 50 covers the side surface of the semiconductor laminate 22, a distance is generated between the semiconductor laminate 22 and the reflective resin 40. Thus, the light emitted from the semiconductor laminate 22 is made incident on the wavelength conversion part 30, to be taken out.

Since the reflective resin 40 is a white resin material, light emitted from the light-emitting element 20 can be reflected by the same and the light-emitting element 20 can be sealed.

The wavelength conversion part 30 includes the columnar first prismatic portion 31 having the bottom surface with a shape covering the upper surface 22a of the semiconductor laminate 22 of the light-emitting element 20, and thus the light traveling from the light-emitting element 20 to the side surface 33a of the first prismatic portion 31 is reflected by the reflecting resin 40. As a result, the light, after traveling toward the side surface 32a of the frustum portion 32, travels toward the upper surface 30b of the wavelength conversion part 30. Therefore, the light extraction efficiency of the light-emitting device 10 can be increased.

Figure 6:
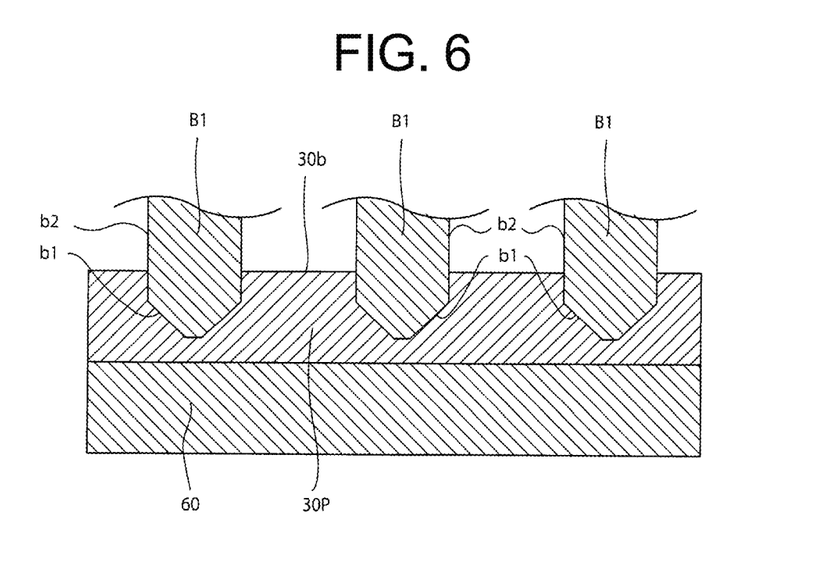
FIG. 6 is an explanatory diagram for describing a manufacturing process of the wavelength conversion part of FIG. 1.
Figure 7:
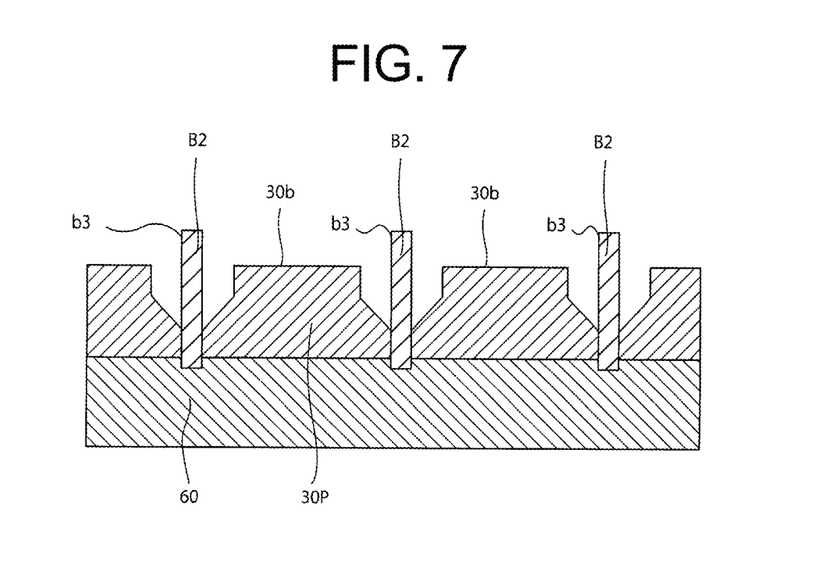
FIG. 7 is an explanatory diagram for describing the manufacturing process of the wavelength conversion part of FIG. 1.

The wavelength conversion part 30 of the light-emitting device 10 described above can be manufactured, for example, by cutting the ceramic plate 30P illustrated in FIGS. 6 and 7. FIG. 6 illustrates a first processing step for processing the ceramic plate 30P. More specifically, FIG. 6 schematically illustrates a cross-section of the dicing sheet 60, the ceramic plate 30P disposed on the dicing sheet 60, and the first blade B1 used in processing the ceramic plate 30P.

The first blade B1 includes a tapered portion b1 of equal leg trapezoidal in cross-section, and a base portion b2 formed following the tapered portion b1 and extending in a direction perpendicular to the upper bottom of the equal leg trapezoidal from the lower portion of the equal leg trapezoidal of the tapered portion b1.

In the first processing step, the ceramic plate 30P is disposed on the dicing sheet 60. The first blade B1 is then inserted in a direction perpendicular to the upper surface of the ceramic plate 30P to form a groove. Specifically, until the tapered portion b1 of the first blade B1 reaches the inside of the ceramic plate 30P, the first blade B1 is inserted into the ceramic plate 30P.

Thus, by the tapered portion b1 and the base portion b2 of the first blade B1, the ceramic plate 30P has a portion to be the frustum portion 32 and a portion to be the second prismatic portion 33. The upper surface of the second prismatic portion 33, i.e., the size and shape of the upper surface 30b of the wavelength conversion part 30 is defined by the arrangement spacing of the first blades B1 adjacent to each other.

FIG. 7 illustrates the second processing step for processing the ceramic plate 30P. In the second processing step, the ceramic plate 30P having been subjected to the first processing step illustrated in FIG. 6 is cut using the second blade B2. As illustrated in FIG. 7, the second blade B2 has a pair of side surfaces b3 parallel to each other.

In the second processing step, the second blade B2 is inserted in the groove formed in the first processing step of the ceramic plate 30P in a direction perpendicular to the ceramic plate 30P. Thus, the plate piece of the ceramic plate 30P which is separated into a single piece becomes the wavelength conversion part 30. Therefore, the second blade B2 forms a portion to be the first prismatic portion 31 in the ceramic plate 30P.

Thus, the wavelength conversion part 30 can be formed by processing the ceramic plate 30P using the first blade B1 and the second blade B2. In other words, by performing the first processing step and the second processing step described above, the wavelength conversion part 30 has the first prismatic portion 31, the frustum portion 32, and the second prismatic portion 33.

As described above, the first prismatic portion 31 is formed in the second processing step. Since the wavelength conversion part 30 has the first prismatic portion 31, it is possible to reduce the occurrence rate of so-called chipping, in which a material is chipped in the manufacturing process of the wavelength conversion part 30.

Specifically, as shown in FIGS. 4 and 5, if the height Ta of the first prismatic portion 31 is 30 μm or more, the occurrence rate of so-called chipping could be reduced. Therefore, when the height Ta of the first prismatic portion 31 is ⅙ or more the height of the wavelength conversion part 30, it is possible to improve the yield of the wavelength conversion part 30.

Further, in FIGS. 4 and 5, when the height Ta of the first prismatic portion 31 is 30 μm or more, the light distributing property is excellent, and for example, when the light-emitting device 10 thus configured is used for a vehicular lamp, a so-called glare problem does not occur.

Second Embodiment

A light-emitting device 10A according to a second embodiment will be described. The light-emitting device 10A according to the second embodiment is different from the light-emitting device 10 according to the first embodiment in terms of the form of the wavelength conversion part. The remaining points are the same as those of the light-emitting device 10 according to the first embodiment, and therefore descriptions thereof will be omitted.

Figure 8:
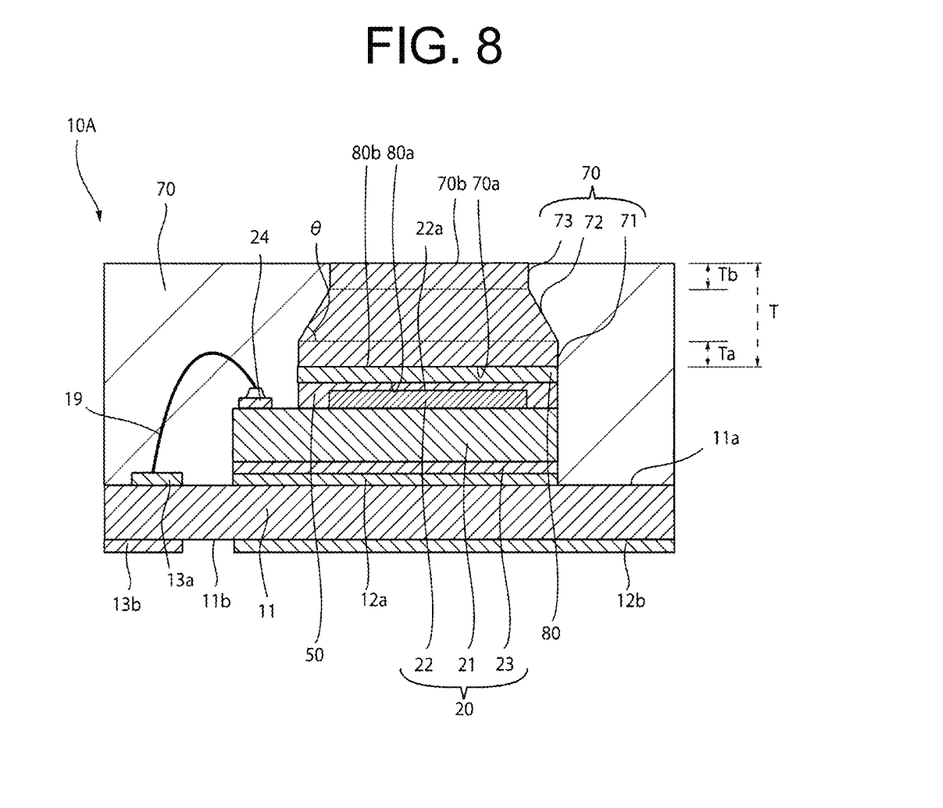
FIG. 8 is a cross-sectional view of a light-emitting device according to a second embodiment.

FIG. 8 illustrates a cross-section of the light-emitting device 10A according to the second embodiment. As illustrated in FIG. 8, a translucent portion 70 as a translucent member has a first prismatic portion 71, a frustum portion 72, and a second prismatic portion 73. The translucent portion 70 is made of a transparent member such as glass, for example. The translucent portion 70 has the same shape as the wavelength conversion part 30 described in the first embodiment.

That is, the first prismatic portion 71 of the translucent portion 70 corresponds to the first prismatic portion 31 of the wavelength conversion part 30. The frustum portion 72 of the translucent portion 70 corresponds to the frustum portion 32 of the wavelength conversion part 30. The second prismatic portion 73 of the translucent portion 70 corresponds to the second prismatic portion 33 of the wavelength conversion part 30. Further, a bottom surface 70a of the translucent portion 70 corresponds to the bottom surface 30a of the wavelength conversion part 30. An upper surface 70b of the translucent portion 70 corresponds to the upper surface 30b of the wavelength conversion part 30. As described above, the translucent portion 70 is different from the wavelength conversion part 30 of the first embodiment in that the translucent portion 70 does not include a fluorescent material such as YAG.

A wavelength conversion part 80 is provided between the semiconductor laminate 22 of the light-emitting element 20 and the translucent portion 70. The wavelength conversion unit 80 is formed in a rectangular plate shape. The wavelength conversion part 80 has a bottom surface having a shape covering the upper surface 22a of the semiconductor laminate 22, i.e., a bottom surface 80a of the wavelength conversion part 80. The bottom surface 80a of the wavelength conversion part 80 is disposed to face to the upper surface 22a of the semiconductor laminate 22. The bottom surface 80a of the wavelength conversion part 80 is formed in a rectangular shape. Further, the bottom surface 80a is formed along the upper surface 22a of the semiconductor laminate 22.

The wavelength conversion part 80 is formed by mixing fluorescent particles such as YAG (Yttrium Aluminum Garnet: $Y_3Al_5O$) to glass or resin, for example.

Thus, even when the light-emitting device 10A is constituted, the height of the translucent portion 70 in a direction perpendicular to the bottom surface 70a is 100 to 300 μm. Further, the height Ta of the first prismatic portion 71 of the translucent portion 70 is ⅙ or more the height T of the translucent portion 70 in a direction perpendicular to the bottom surface 70a thereof.

Light emitted from the light-emitting element 20 travels and enters through the bottom surface 70a of the translucent portion 70. Specifically, the outgoing light enters the frustum portion 72 through the first prismatic portion 71. The outgoing light is reflected toward the upper surface 70b or the light exiting surface, while its traveling direction is changed inwardly of the translucent portion 70 at the side surface of the frustum portion 72. As a result, the light emitted from the light-emitting element 20 is focused toward the light exiting surface.

At this time, for example, when the height Ta of the first prismatic portion 71 is less than ⅙ the height T of the translucent portion 70, the component of the outgoing light which is not reflected by the side surface of the first prismatic portion 71 but is directly reflected by the side surface of the frustum portion 72 increases.

In contrast, when the height Ta of the first prismatic portion 71 is ⅙ or more the height T of the translucent portion 70, the component of the outgoing light which is reflected by the side surface of the first prismatic portion 71 and then reflected by the side surface of the frustum portion 72 increases.

As a result, the light-emitting device 10 according to the present embodiment has high light extraction efficiency because the light emitted from the light-emitting element 20 can travel to the upper surface 70b side of the translucent portion 70. In particular, since the side surface of the second prismatic portion 73 is formed in a prism shape, it is possible to prevent the light extraction efficiency from decreasing.

Further, in the light-emitting device 10A according to this embodiment, the wavelength conversion part 80 is disposed on the side of the mounting substrate 11 which has higher thermal conductivity than the light-emitting device 10 of the first embodiment, and thus heat emitted from the wavelength conversion part 80 can be efficiently conducted to the mounting substrate 11 side. This makes it possible to improve the reliability of the light-emitting device 10A with respect to heat.

In the aforementioned embodiments, examples in which two light-emitting elements 20 are mounted on the mounting substrate 11 has been described. However, the number of the light-emitting elements 20 mounted on the mounting substrate 11 may be one or two or more.

It will be apparent to those skilled in the art that various modifications and variations can be made in the present invention without departing from the spirit or scope of the present invention. Thus, it is intended that the present invention cover the modifications and variations of the present invention provided they come within the scope of the appended claims and their equivalents. All related art references described above are hereby incorporated in their entirety by reference.

What is claimed is:

1. A light-emitting device comprising:
a light-emitting element configured to emit light;
a translucent member which is disposed on the light-emitting element and has a columnar first portion having a bottom surface opposed to an upper surface of the light-emitting element, the upper surface being an uppermost surface of the light-emitting device, a second portion formed continuously with the first portion on the first portion and narrowed upward, and a columnar third portion formed continuously with the second portion on the second portion, the uppermost surface of the light-emitting element being covered by the bottom surface of the first portion, such that (1) none of the second portion and the third portion contacts the light-emitting element, and (2) none of the first portion, the second portion, and the third portion is provided on a side surface of the light-emitting element; and
a reflective member configured to cover side surfaces of the translucent member, wherein
a height of the first portion of the translucent member in a direction perpendicular to the bottom surface thereof is ⅙ or more a height of the translucent member in the direction perpendicular to the bottom surface, and
the first portion, the second portion, and the third portion of the translucent member are continuously and integrally formed with each other with a same material.

2. The light-emitting device according to claim 1, wherein the height of the translucent member in the direction perpendicular to the bottom surface is 30 μm to 300 μm.

3. The light-emitting device according to claim 1, wherein the translucent member contains a fluorescent material that converts a wavelength of the light emitted from the light-emitting element.

4. The light-emitting device according to claim 2, wherein the translucent member contains a fluorescent material that converts a wavelength of the light emitted from the light-emitting element.

5. The light-emitting device according to claim 1, comprising a wavelength conversion member provided between the translucent member and the light-emitting element, the wavelength conversion member being configured to convert a wavelength of the light emitted from the light-emitting element.

6. The light-emitting device according to claim 2, comprising a wavelength conversion member provided between the translucent member and the light-emitting element, the wavelength conversion member being configured to convert a wavelength of the light emitted from the light-emitting element.

7. The light-emitting device according to claim 1, wherein the second portion of the translucent member is formed into a frustum shape.

8. The light-emitting device according to claim 2, wherein the second portion of the translucent member is formed into a frustum shape.

9. The light-emitting device according to claim 3, wherein the second portion of the translucent member is formed into a frustum shape.

10. The light-emitting device according to claim 4, wherein the second portion of the translucent member is formed into a frustum shape.

11. The light-emitting device according to claim 5, wherein the second portion of the translucent member is formed into a frustum shape.

12. The light-emitting device according to claim 6, wherein the second portion of the translucent member is formed into a frustum shape.

13. The light-emitting device according to claim 1, wherein the upper surface of the light-emitting element has a larger area than an upper surface of the third portion of the translucent member.

14. The light-emitting device according to claim 2, wherein the upper surface of the light-emitting element has a larger area than an upper surface of the third portion of the translucent member.

15. The light-emitting device according to claim 3, wherein the upper surface of the light-emitting element has a larger area than an upper surface of the third portion of the translucent member.

16. The light-emitting device according to claim 5, wherein the upper surface of the light-emitting element has a larger area than an upper surface of the third portion of the translucent member.

17. The light-emitting device according to claim 3, wherein
the light-emitting element includes a support substrate and a semiconductor laminate disposed on the support substrate, and
the translucent member containing the fluorescent material has a bottom surface which is bonded to an upper surface of the semiconductor laminate.

18. The light-emitting device according to claim 5, wherein
the light-emitting element includes a support substrate and a semiconductor laminate disposed on the support substrate, and
the wavelength conversion member has a bottom surface which is bonded to an upper surface of the semiconductor laminate.

19. The light-emitting device according to claim 17, wherein
the bottom surface of the translucent member containing the fluorescent material is bonded to the upper surface of the semiconductor laminate with a transparent adhesive so that the transparent adhesive covers side surfaces and the upper surface of the semiconductor laminate and the bottom surface of the translucent member.

20. The light-emitting device according to claim 18, wherein
the bottom surface of the wavelength conversion member is bonded to the upper surface of the semiconductor laminate with a transparent adhesive so that the transparent adhesive covers side surfaces and the upper surface of the semiconductor laminate and the bottom surface of the wavelength conversion member.

21. The light-emitting device according to claim 1, wherein an entire area of the uppermost surface of the light-emitting element is covered by the bottom surface of the first portion from above the light-emitting element.

* * * * *